(12) United States Patent
Saruwatari

(10) Patent No.: US 7,102,075 B1
(45) Date of Patent: Sep. 5, 2006

(54) ELECTRONIC CIRCUIT UNIT AND ITS SEALED STRUCTURE

(75) Inventor: Eiji Saruwatari, Tachikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/219,103

(22) Filed: Sep. 1, 2005

Related U.S. Application Data

(62) Division of application No. 11/089,910, filed on Mar. 24, 2005, now Pat. No. 7,009,107.

(30) Foreign Application Priority Data

Mar. 22, 2005 (JP) .............................. 2005-082377

(51) Int. Cl.
*H05K 9/00* (2006.01)
(52) U.S. Cl. .............................. 174/35 GC; 174/35 R
(58) Field of Classification Search ............. 174/35 R, 174/35 GC; 361/800, 816, 818
See application file for complete search history.

(56) References Cited

U.S. PATENT DOCUMENTS

| 5,412,340 A | * | 5/1995 | Tanikoshi | ..................... 330/68 |
| 5,917,708 A | | 6/1999 | Moran | |
| 6,600,663 B1 | * | 7/2003 | Koleda | ....................... 361/816 |

FOREIGN PATENT DOCUMENTS

JP    2001-144487 A    5/2001

* cited by examiner

*Primary Examiner*—Hung V. Ngo
(74) *Attorney, Agent, or Firm*—Frishauf, Holtz, Goodman & Chick, P.C.

(57) ABSTRACT

A first frame is arranged on a printed circuit board to enclose a first circuit that radiates a noise. The printed circuit board also has mounted thereon a second circuit that has a need to be protected from the noise. A second frame is arranged on the printed circuit board to enclose the second circuit. The second frame is separated from one side of the first frame by a given clearance area, and the second frame has an open side facing the one side of the first frame.

8 Claims, 4 Drawing Sheets

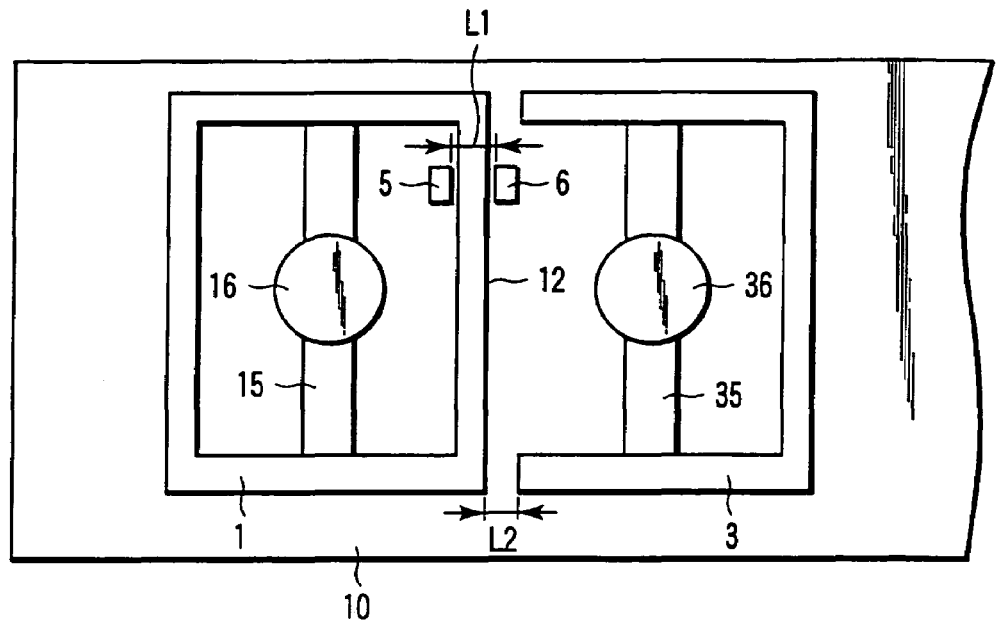
F I G. 3
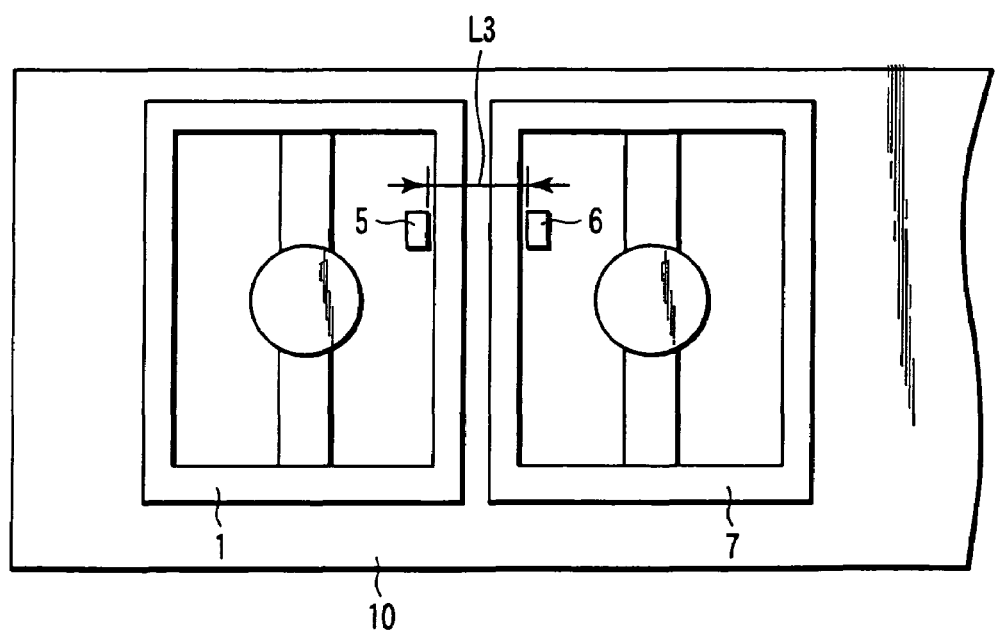
F I G. 4

ELECTRONIC CIRCUIT UNIT AND ITS SEALED STRUCTURE

CROSS-REFERENCE TO RELATED APPLICATIONS

This application is a Division of application Ser. No. 11/089,910, filed Mar. 24, 2005 now U.S. Pat. No. 7,009,107, which is based upon and claims the benefit of priority from prior Japanese Patent Application No. 2005-82377, filed Mar. 22, 2005, the entire contents of which are incorporated herein by reference.

BACKGROUND OF THE INVENTION

1. Field of the Invention

The present invention relates to an electronic circuit unit built in small-sized electronic apparatuses such as mobile phones and PDA (Personal digital Assistants), and to its shield structure.

2. Description of the Related Art

In general, small-sized electronic apparatuses such as mobile phones and PDA have a built-in electronic circuit unit, which is mounted with many circuit devices on a printed circuit board. The circuit devices include the following circuit device groups. One is a circuit device group such as CPU (Central Processing Unit) and DSP (digital signal Processor) radiating a noise. Another is a circuit device group such as radio circuit, which is easy to receive an influence by noise. In the foregoing circuit device groups, the noise radiated from the circuit device group such as CPU gives an influence to the circuit device group such as radio circuit depending on the positional relationship. As a result, this is very unfavorable because radio transmitting and receiving performance is reduced.

Conventionally, the following structure has been employed. For example, two frames produced by sheet metal processing are prepared. The circuit device group radiating the noise is enclosed with one of two frames; on the other hand, the circuit device group readily receiving the influence by noise is enclosed with the other thereof. The structure described above is given, and thereby, each frame functions as a shield case; therefore, the influence by the noise is reduced between the foregoing circuit device groups.

However, if the foregoing two frames are located separately from each other, a clearance area for repair must be secured between these frames. For this reason, these frames must be arranged with a given distance or more. As a result, the electronic circuit unit is inevitably configured into a large size. This is difficult to meet the requirements such as miniaturization of electronic apparatus and high packaging density of circuit device resulting from high function of apparatus.

Moreover, the shield structure given below has been proposed. According to the shield structure, a partition plate is provided in a rectangular frame to form two independent rooms. The foregoing two rooms each receive the circuit device group radiating the noise and the circuit device group readily receiving the influence by noise. The technique is detailedly disclosed in JPN. PAT. APPLN. KOAKI Publication No. 2001-144487.

However, according to the foregoing shield structure, the frame is configured to a large size. If the frame is produced using sheet metal processing, the flatness of the frame is reduced. This is a factor of causing packaging failure when the frame is mounted on a printed circuit board. Moreover, if the upper opening portion of the frame is attached with a cover, the frame and the cover are formed into a large size; for this reason, a gap is readily formed between the frame and the cover. This is a factor of reducing the uniformity of isolation characteristic between circuit devices.

BRIEF SUMMARY OF THE INVENTION

The present invention has been made in view of the foregoing circumstances. An object of the present invention is to provide an electronic circuit unit, which prevents a reduction of packaging quality by the scale-up of a frame, and enables high density of device packaging while securing a necessary clearance area, and to its shield structure.

In order to achieve the foregoing object, according to one aspect of the present invention, there is provided an electronic circuit unit and its shield structure. A first frame is arranged on a printed circuit board mounted with a first circuit radiating a noise and a second circuit having a need to protect it from the noise to enclose the first circuit. A second frame is prepared in a state of removed one of several sides forming the frame, which is faces the side of the first frame. The second frame is arranged on the printed circuit board to enclose the second circuit with a given clearance area with respect to one side of the first frame.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a top plan view to explain the relationship in arrangement between the first and second shield cases of the electronic circuit unit according to one embodiment of the present invention;

FIG. 4 is a top plan view to explain the electronic circuit unit shown in FIG. 1 to FIG. 3 and the effect of the shield structure;

DETAILED DESCRIPTION OF THE INVENTION

An embodiment of the present invention will be described below with reference to the accompanying drawings.

An electronic circuit unit according to one embodiment of the present invention includes first and second shield cases. The first shield case receives circuit devices radiating a noise, and the second shield case receives circuit devices having a need to protect them from the noise.

The circuit devices radiating a noise include circuit devices forming a digital circuit such as CPU (Central Processing Unit) and DSP (Digital Signal Processor). On the other hand, the circuit devices having a need to protect them from the noise include high frequency circuit devices such as LSI (Large Scale integrated Circuit) forming a radio circuit.

Figure 1:
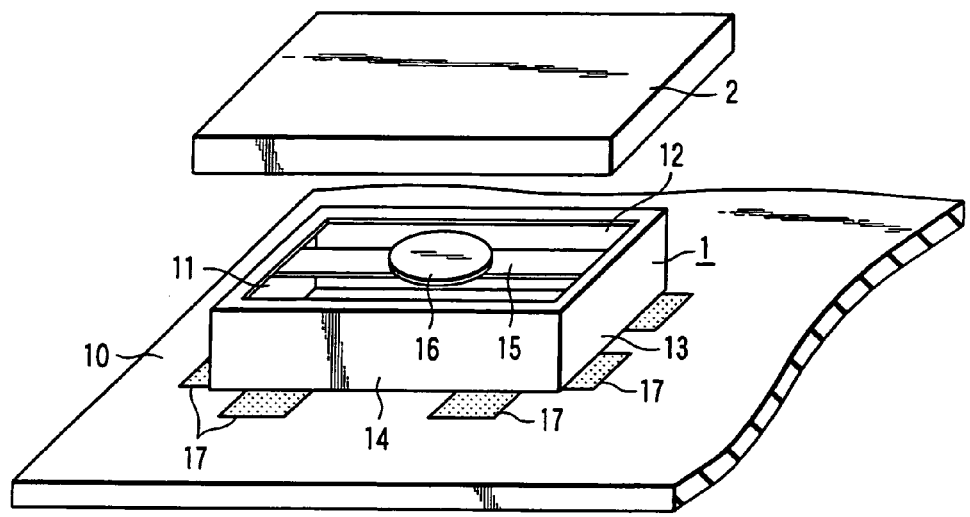
FIG. 1 is a perspective view showing the shield structure of a first shield case of an electronic circuit unit according to one embodiment of the present invention.

As shown in FIG. 1, the first shield case is composed of a metal frame 1 and a metal cover 2 attached to the metal frame 1. The metal frame 1 comprises a rectangular frame having four sides 11 to 14, and is produced using sheet metal processing. A pair of mutually opposed sides 11 and 13 of the metal frame 1 is connected via a bridge member 15. The bridge member 15 functions as a reinforcement member for protecting the metal frame 1 from deformation. The bridge member 15 is provided with an adsorption member 16 at the central portion. The adsorption member 16 is used for lifting up the metal frame 1 by a robot arm when the metal frame 1 is mounted on a printed circuit board 10.

The metal frame 1 is positioned and fixed on the printed circuit board 10 to enclose circuit devices (not shown) radiating a noise. Soldering is used as the fixing means. In FIG. 1, reference numerals 17 denote the soldering pattern.

The metal cover 2 is produced using sheet metal processing like the metal frame 1. The metal cover 2 closes the metal frame 1 so that noise radiated from circuit devices received in the metal frame 1 does not externally leak from there. The metal cover 2 is attached to the upper opening portion of the metal frame 1.

Figure 2:
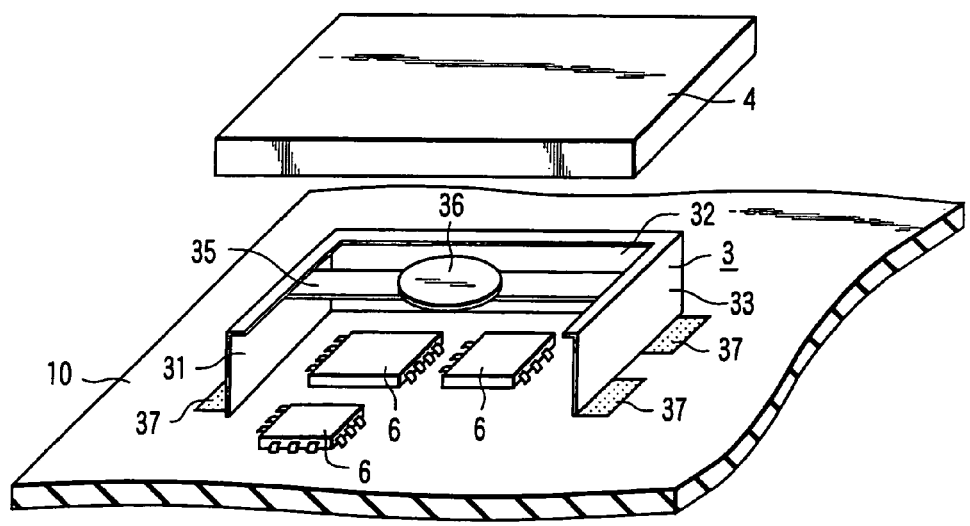
FIG. 2 is a perspective view showing the shield structure of a second shield case of the electronic circuit unit according to one embodiment of the present invention.

As illustrated in FIG. 2, the second shield case is composed of a metal frame 3 and a metal cover 4 attached to the metal frame 3. The metal frame 3 is produced using sheet metal processing in a manner that one of four sides forming a rectangular frame is removed. A pair of mutually opposed sides 31 and 33 of the metal frame 3 is connected via a bridge member 35. The bridge member 35 functions as a reinforcement member for protecting the metal frame 3 from deformation. The bridge member 35 is provided with an adsorption member 36 at the central portion. The adsorption member 36 is used for lifting up the metal frame 3 by a robot arm when the metal frame 3 is mounted on a printed circuit board 10 like the metal frame 1 described before.

The metal frame 3 is positioned and fixed on the printed circuit board 10 to enclose circuit device groups 6 having a need to protect them from a noise. Soldering is used as the fixing means. In FIG. 2, reference numerals 37 denote the soldering pattern.

The metal cover 4 is produced using sheet metal processing like the metal frame 3. The metal cover 4 closes the metal frame 3 to prevent a noise radiated from circuit devices received in the metal frame 1 from intruding into the metal frame 3 and from giving an influence to the circuit device group 6. The metal cover 4 is attached to the upper opening portion of the metal frame 3.

The foregoing metal frames 1 and 3 are arranged on the printed circuit board 10 in the following manner. FIG. 3 is a top plan view to explain the arrangement relationship.

More specifically, the metal frame 3 is arranged so that the removed side is opposed to the side 12 of the metal frame 1. In this case, the metal frame 3 is positioned opposing to the metal frame 1 with a distance L2. The distance L2 is given, and thereby, a clearance area is secured between the metal frames 1 and 3. The clearance area is used for repairing packaging (mounting) failure relevant to the metal frames 1 and 3.

As described above, one side of the metal frame 3 forming the second shield case is removed. By doing so, the clearance area required for repair is secured between the metal frames 1 and 3 while the packaging distance of circuit devices 5 and 6 is made small. As a result, circuit device packaging density is enhanced in the printed circuit board 10 having a limited packaging area. In other words, it is possible to meet the requirements such as miniaturization and high packaging density in the electronic circuit unit.

For example, metal frames 1 and 7 formed into a frame shape are used as the first and second shield cases, respectively, as depicted in FIG. 4. In this case, the packaging distance must be set considering the thickness of the sides of both metal frames 1 and 7 as seen from a wide distance L3 in FIG. 4. This is a factor of causing a reduction of the packaging density.

According to this embodiment, the metal frames 1 and 3 are produced separately from each other. Thus, the flatness of these metal frames 1 and 3 is enhanced. As a result, it is possible to reduce packaging failure cased when the metal frames 1 and 3 are mounted on the printed circuit board 10. This contributes to improving the yield and the shield effect.

Moreover, the metal covers 2 and 4 are produced separately from each other. Thus, the flatness of these metal covers 2 and 4 is enhanced. As a result, a gap is hard to be formed between the frame and cover in a state that the covers 2 and 4 are attached to the metal frames 1 and 3. Therefore, this contributes to enhancing uniformity in isolation characteristic between circuit devices 5 and 6.

If the first and second shield cases are each composed of one rectangular frame and its cover, the frame and the cover are formed into a large scale. For this reason, the flatness of the frame and the cover is reduced. As a result, a gap is readily formed between the frame and the printed circuit board and between the frame and the cover. This is a factor of reducing isolation characteristic between circuit devices.

Figure 5:
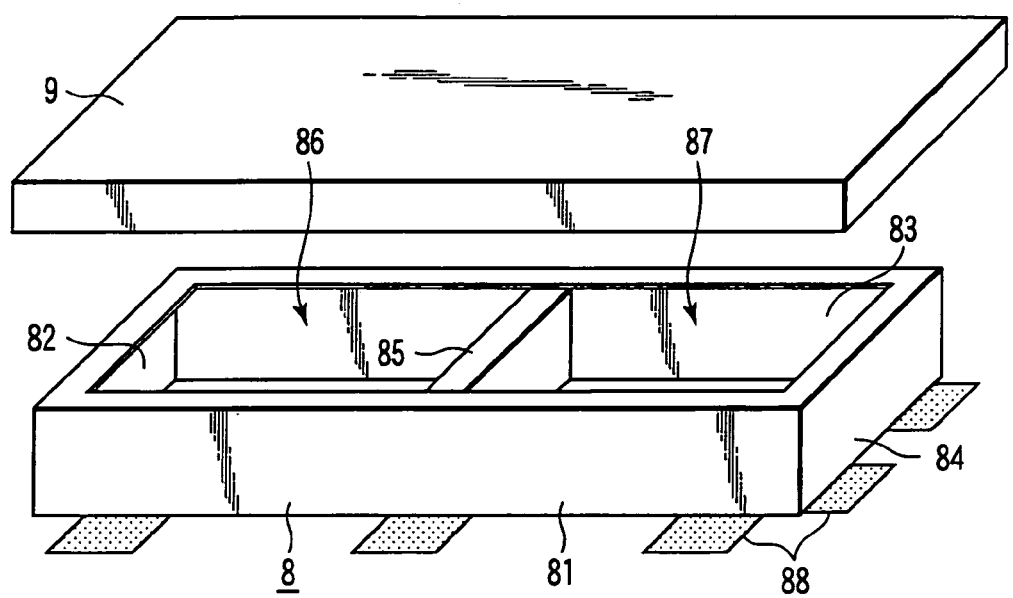
FIG. 5 is a top plan view to explain the electronic circuit unit shown in FIG. 1 to FIG. 3 and the effect of the shield structure.

For example, a rectangular metal frame 8 having four sides 81 to 84 is prepared as seen from FIG. 5. A partition plate 85 is provided in the metal frame 8 to form two independent rooms 86 and 87. These rooms 86 and 87 receive a circuit device group radiating a noise and a circuit device group easy to receive an influence by noise, respectively. In FIG. 5, a reference numeral 9 denotes a metal cover, and a reference numeral 88 denotes a soldering pattern for mounting the metal frame 8 on a printed circuit board.

If the foregoing shield case is produced using sheet metal processing, both frame 8 and cover 9 are made into a large scale. For this reason, the flatness is reduced; as a result, uniformity of isolation characteristic is not obtained as described before.

According to this embodiment, mutually opposing sides of the metal frames 1 and 3 are connected via the bridge members 15 and 35. Therefore, the structural strength of these metal frames 1 and 3 is enhanced, thereby reducing packaging failure of the metal frames 1 and 3 and enhancing the shield effect. Moreover, it is possible to improve the reliability of an electronic circuit unit.

According to this embodiment, the foregoing bridge members 15 and 35 are provided with the adsorption members 16 and 36, respectively. Thus, these metal frames 1 and 3 are lifted up using a robot arm when mounting them on the printed circuit board 10. By doing so, the metal frames 1 and 3 are automatically mounted.

Figure 6:
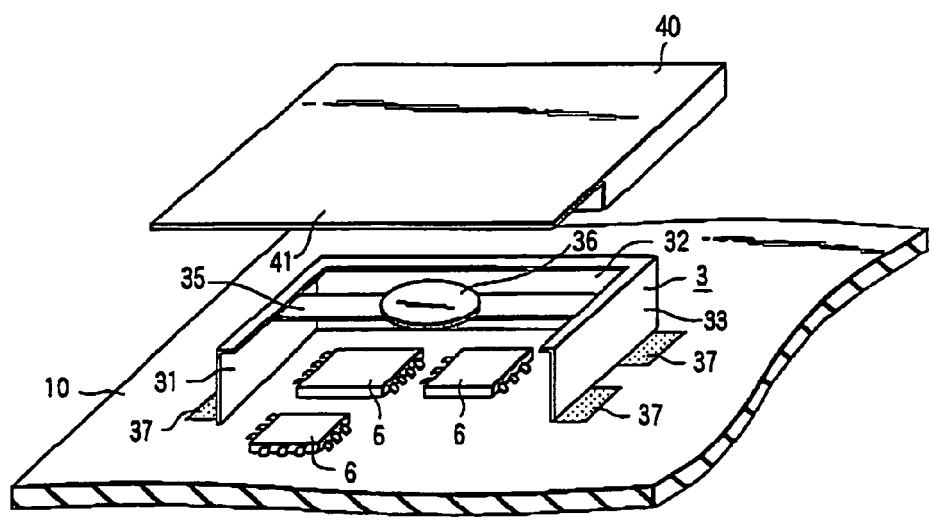
FIG. 6 is a perspective view showing the shield structure of a second shield case of the electronic circuit unit according to another embodiment of the present invention.
Figure 7:
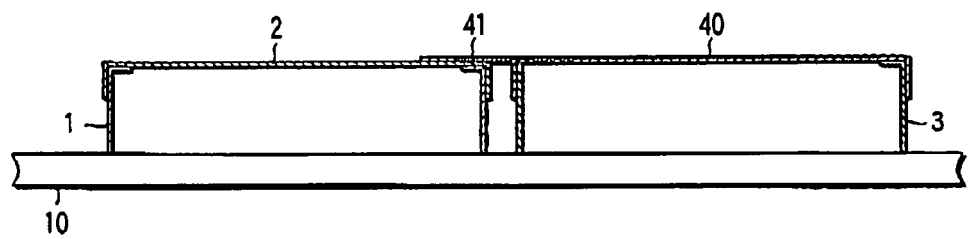
FIG. 7 is a cross-sectional view to explain the relationship in arrangement between the first shield case of the electronic circuit unit according to one embodiment of the present invention and the second shield case shown in FIG. 6.

The present invention is not limited to the foregoing embodiment. For example, at least one of the metal covers 2 and 4 shown in FIG. 1 and FIG. 2 may be provided with an extended portion. For example, as shown in FIG. 6, a cover 40 including an extended portion 41 may be attached to the metal frame 3 according to another embodiment of the present invention. The extended portion 41 comprises a flange or protrusion. When the metal covers 2 and 40 are attached to the metal frames 1 and 3, the extended portion 41 is overlapped with the metal cover 2, as shown in FIG. 7. The structure described above is given, and thereby, the metal covers 2 and 40 are electrically integrated. This serves to further enhance the shield effect. The metal cover 40 may be attached to the metal frame 1 instead of to the metal frame 3.

In the foregoing embodiment, the metal frames 1 and 3 each comprise a rectangular shape having four sides. In this case, the metal frames 1 and 3 may each comprise a polygon frame having four sides or more. If several sides of the metal frame 1 are opposed to those of the metal frame 3, these opposed sides may be removed.

Besides, various modifications of the features given below may be made within the scope without diverging from the subject matter of the present invention. The features are as follows:

Structure and shape of the printed circuit board;
Shape and structure of first and second frames and covers;
Presence, position and shape of the bridge member; and
Kind of a first circuit radiating a noise and a second circuit having a need to protect it from the noise In short, the present invention is not limited to the foregoing embodiment. In the wording stage, components may be modified within the scope without diverging from the subject matter of the invention. Several components disclosed in the foregoing embodiment are properly combined, and thereby, various inventions are formed. For example, some components may be deleted from all components disclosed in the embodiment. Components relevant to different embodiment may be properly combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic circuit unit comprising:
   a printed circuit board mounted with a first circuit and a second circuit;
   a first frame arranged on the printed circuit board around the first circuit;
   a second frame arranged on the printed circuit board around the second circuit, said second frame being separated from one side of the first frame by a given clearance area, and said second frame having an open side facing the one side of the first frame;
   a first cover which closes an upper opening portion of the first frame; and
   a second cover which is independent of the first frame, and which closes an upper opening portion of the second frame;
   wherein at least one of the first and second covers comprises an extended portion that overlaps the other of the first and second covers.

2. An electronic circuit unit comprising:
   a printed circuit board mounted with a first circuit that radiates a noise and a second circuit that has a need to be protected from the noise;
   a first frame arranged on the printed circuit board around the first circuit;
   a second frame arranged on the printed circuit board around the second circuit, said second frame being separated from one side of the first frame by a given clearance area, and said second frame having an open side facing the one side of the first frame;
   a first cover which closes an upper opening portion of the first frame; and
   a second cover which is independent of the first frame, and which closes an upper opening portion of the second frame;
   wherein at least one of the first and second covers comprises an extended portion that overlaps the other of the first and second covers.

3. The unit according to claim 2, wherein at least one of the first and second frames comprises a bridge member extending between opposing sides thereof.

4. The unit according to claim 3, wherein the bridge member comprises an adsorption member for lifting up the frame.

5. A shield structure comprising:
   a first frame arranged on a printed circuit board around a first circuit, said printed circuit board also having mounted thereon a second circuit;
   a second frame arranged on the printed circuit board around the second circuit, said second frame being separated from one side of the first frame by a given clearance area, and said second frame having an open side facing the one side of the first frame;
   a first cover which closes an upper opening portion of the first frame; and
   a second cover which is independent of the first frame, and which closes an upper opening portion of the second frame;
   wherein at least one of the first and second covers comprises an extended portion that overlaps the other of the first and second covers.

6. A shield structure comprising:
   a first frame arranged on a printed circuit board around a first circuit that radiates a noise, said printed circuit board also having mounted thereon a second circuit that has a need to be protected from the noise;
   a second frame which is arranged on the printed circuit board around the second circuit, said second frame being separated from one side of the first frame by a given clearance area, and said second frame having an open side facing the one side of the first frame;
   a first cover which closes an upper opening portion of the first frame; and
   a second cover which is independent of the first frame, and which closes an upper opening portion of the second frame;

wherein at least one of the first and second covers comprises an extended portion that overlaps the other of the first and second covers.

7. The structure according to claim 6, wherein at least one of the first and second frames comprises a bridge member extending between opposing sides thereof.

8. The structure according to claim 7, wherein the bridge member comprises an adsorption member for lifting up the frame.

* * * * *